United States Patent
Wu et al.

(10) Patent No.: US 7,771,895 B2
(45) Date of Patent: *Aug. 10, 2010

(54) METHOD OF ETCHING EXTREME ULTRAVIOLET LIGHT (EUV) PHOTOMASKS

(75) Inventors: Banqiu Wu, Sunnyvale, CA (US); Madhavi R. Chandrachood, Sunnyvale, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 765 days.

This patent is subject to a terminal disclaimer.

(21) Appl. No.: 11/532,280

(22) Filed: Sep. 15, 2006

(65) Prior Publication Data

US 2008/0070128 A1    Mar. 20, 2008

(51) Int. Cl.
    *G03F 1/00*    (2006.01)
(52) U.S. Cl. .................. 430/5; 438/200; 430/394
(58) Field of Classification Search ............ 430/5, 430/394; 438/200; 216/67
See application file for complete search history.

(56) References Cited

U.S. PATENT DOCUMENTS

| | | | |
|---|---|---|---|
| 6,749,974 B2 | 6/2004 | Chan | |
| 2002/0160559 A1* | 10/2002 | Lee et al. | 438/200 |
| 2003/0123605 A1 | 7/2003 | Rau | |
| 2004/0072081 A1 | 4/2004 | Coleman et al. | |
| 2005/0042523 A1* | 2/2005 | Wu et al. | 430/5 |
| 2005/0238963 A1* | 10/2005 | Ishibashi et al. | 430/5 |
| 2006/0008749 A1* | 1/2006 | Sobel et al. | 430/394 |
| 2006/0051681 A1* | 3/2006 | Taylor | 430/5 |
| 2006/0060565 A9* | 3/2006 | Nallan et al. | 216/67 |
| 2006/0166109 A1* | 7/2006 | Yan | 430/5 |
| 2007/0238033 A1 | 10/2007 | Kanayama et al. | |

OTHER PUBLICATIONS

Wu, Banqiu, "Thermodynamic study of photomask plasma etching", Oct. 2004.
Wu, Banqiu, et al., "65 nm node photomask etching with zero CD process bias", Nov. 2005.
Wu, Banqiu, "Photomask plasma etching: A review," J. Vac. Sci. Technol. B 24(1), Jan./Feb. 2006, pp. 1-15.
Office Action from the State Intellectual Property Office of the People's Republic of China received Mar. 31, 2010 for Chinese Patent Application No. 200710140139.6.

* cited by examiner

*Primary Examiner*—Mark F Huff
*Assistant Examiner*—Rashid Alam
(74) *Attorney, Agent, or Firm*—Moser IP Law Group

(57) ABSTRACT

Embodiments of methods of etching EUV photomasks are provided herein. In one embodiment, a method of etching an extreme ultraviolet photomask includes providing a photomask comprising, in order, a substrate, a multi-material layer, a capping layer, and a multi-layer absorber layer, the multi-layer absorber layer comprising a self-mask layer disposed over a bulk absorber layer, wherein the self-mask layer comprises tantalum and oxygen and the bulk absorber layer comprises tantalum and essentially no oxygen; etching the self-mask layer using a first etch process; and etching the bulk absorber layer using a second etch process different than the first, wherein the etch rate of the bulk absorber layer is greater than the etch rate of the self-mask layer during the second etch process.

26 Claims, 3 Drawing Sheets

METHOD OF ETCHING EXTREME ULTRAVIOLET LIGHT (EUV) PHOTOMASKS

BACKGROUND OF THE INVENTION

1. Field of the Invention

Embodiments of the present invention generally relate photomasks used in the fabrication of semiconductor devices, more specifically, to extreme ultraviolet light (EUV) photomasks and methods of etching thereof.

2. Description of the Related Art

In the manufacture of integrated circuits (IC), or chips, patterns representing different layers of the chip are created on a series of reusable photomasks (also referred to herein as masks) in order to transfer the design of each chip layer onto a semiconductor substrate during the manufacturing process. The masks are used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask generally comprises a transparent substrate having an opaque, light-absorbing layer disposed thereon. Conventional masks typically include a glass or quartz substrate having a layer of chromium on one side. The chromium layer is covered with an anti-reflective coating and a photosensitive resist. During a patterning process, the circuit design is written onto the mask, for example, by exposing portions of the resist to an electron beam or ultraviolet light, thereby making the exposed portions soluble in a developing solution. The soluble portion of the resist is then removed, allowing the exposed underlying chromium and anti-reflective layers to be etched (i.e., removed).

With the shrink of critical dimensions (CD), present optical lithography is approaching a technological limit at the 45 nanometer (nm) technology node. Next generation lithography (NGL) is expected to replace the current optical lithography method, for example, in the 32 nm technology node and beyond. There are several NGL candidates such as extreme ultraviolet (EUV) lithography (EUVL), electron projection lithography (EPL), ion projection lithography (IPL), nanoimprint, and X-ray lithography. Of these, EUVL is the most likely successor due to the fact that EUVL has most of the properties of optical lithography, which is a more mature technology as compared with other NGL methods.

However, EUV mask fabrication still has technological challenges to overcome. For example, EUV mask etch process optimization is still in the pioneering stage. The key challenges of EUV mask fabrication include etch CD bias control, etch CD uniformity, cross sectional profiles, etch CD linearity, etch selectivity, and defectivity control. Due to the tight specifications and reduced CD tolerances of EUV masks, CD control becomes more critical. A nearly zero etch CD bias is expected to be required to meet the mean to target (MTT) CD requirement and uniformity control.

The main etch CD bias issues result from erosion of the photoresist—which is a soft mask. Final mask CD properties are the contribution of pattern generation and pattern transfer processes (etch). Some intrinsic CD non-uniformity may exist prior to etch, such as fogging effects in the photoresist due to the e-beam writing process. A thinner resist layer is helpful to control this non-uniformity, but the resist thinness is limited by the thickness of subsequently etched layers due to limited etch selectivity (e.g., during pattern transfer, resist is consumed significantly because of the limited etch rate selectivity of absorber materials to resist). The more resist is consumed, the lower the fidelity of a pattern transfer process.

To overcome the photoresist limitation, use of a hard mask was proposed for the CD control. However, an extra hard mask will make mask fabrication much more complicated. When the hard mask finishes its function, it has to be removed without affecting other layers (e.g., without affecting the absorber layer and buffer/capping layers, and without introducing any defects to the mask). This imposes a high mask selectivity requirement, thereby making EUV mask fabrication even more challenging. High cost and low production yields caused by use of a hard mask are additional concerns.

Thus, there is a need for an improved EUV mask and fabrication method.

SUMMARY OF THE INVENTION

Embodiments of methods of etching EUV photomasks are provided herein. In one embodiment, a method of etching an extreme ultraviolet photomask includes providing a photomask comprising, in order, a substrate, a multi-material EUV reflective layer, a capping layer, and a multi-layer absorber layer, the multilayer absorber layer comprising a self-mask layer disposed over a bulk absorber layer, wherein the self-mask layer comprises tantalum and oxygen and the bulk absorber layer comprises tantalum and essentially no oxygen; etching the self-mask layer using a first etch process; and etching the bulk absorber layer using a second etch process different than the first, wherein the etch rate of the bulk absorber layer is greater than the etch rate of the self-mask layer during the second etch process.

In another embodiment, a method for creating an image on a blank extreme ultraviolet photomask comprising a photoresist layer, an opaque layer underlying the photoresist layer having an anti-reflective sub-layer and a bulk sub-layer, a capping layer, and a substrate layer, includes creating a patterned image in the photoresist layer; removing portions of the photoresist layer that do not correspond to the patterned image thereby exposing portions of the anti-reflective sub-layer of the opaque layer not corresponding to the patterned image; removing the exposed portions of the anti-reflective sub-layer that do not correspond to the patterned image using a first etch process, thereby exposing portions of the bulk sub-layer not corresponding to the patterned image; removing the exposed portions of the bulk sub-layer underlying the anti-reflective sub-layer that do not correspond to the patterned image using a second etch process having a bulk sub-layer removal rate that is at least 10 time greater than an anti-reflective sub-layer removal rate, thereby exposing portions of the capping layer that do not correspond to the patterned image; and removing the photoresist layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The images in the drawings are simplified for illustrative purposes and are not depicted to scale.

DETAILED DESCRIPTION

Figure 1A:
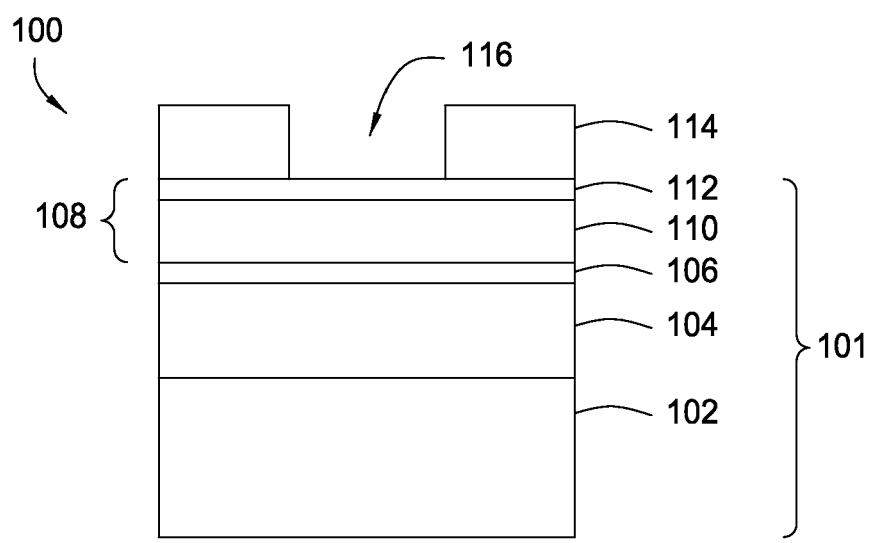
FIGS. 1A-C depict one embodiment of a fabrication sequence for an EUV mask utilizing one embodiment of the method of the present invention.
Figure 1B:
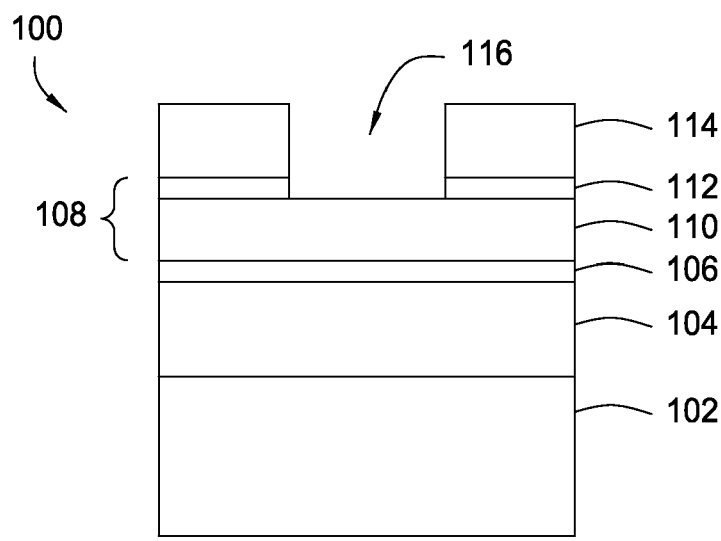
Figure 1C:
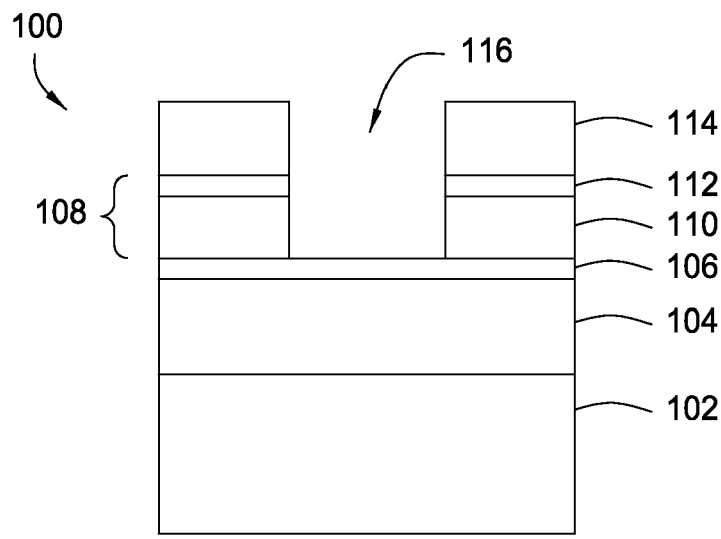
Figure 2:
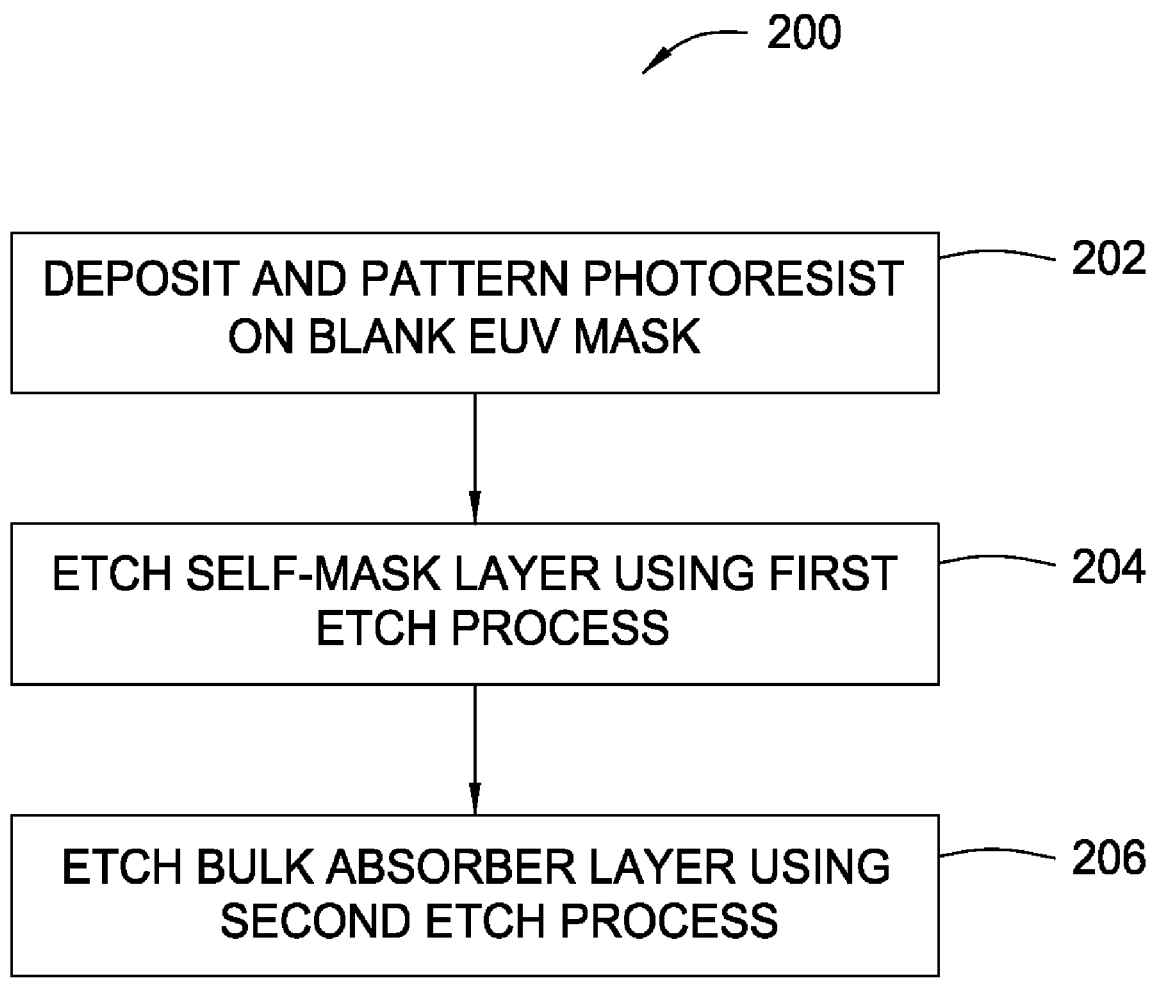
FIG. 2 depicts a flow diagram of one embodiment of a method for etching the EUV mask of FIG. 1.

The present invention provides methods of etching EUV photomasks that reduce the etch CD bias and improve pattern transfer fidelity. The process for creating a finished mask, having improved critical dimensions and uniformity, from a blank EUV mask is described below with reference to FIGS. 1-2. FIGS. 1A-C depict one embodiment of a fabrication sequence for an EUV mask utilizing one embodiment of the method of the present invention. FIG. 2 depicts a flow diagram of one embodiment of a method 200 for etching an EUV mask as described with reference to FIGS. 1A-C. The method 200 may be performed in a TETRA™ I, TETRA™ II, or DPS® II etch chamber available from Applied Materials, Inc. of Santa Clara, Calif., or other suitable etch chamber, as described below with respect to FIG. 3. The method 200 may be stored in a computer readable form in the memory of a controller or other storage medium of the chamber.

The method 200 begins at step 202 where a photoresist layer 114 is deposited atop an EUV mask 100 and is patterned to form an opening 116 corresponding to a design to be transferred to the EUV mask 100 (as depicted in FIG. 1A). The EUV mask 100 begins as a blank EUV mask 101 and includes, in order, a substrate 102, an EUV reflective multi-material layer 104, a capping layer 106, and a multi-layer absorber layer 108. Optionally, a buffer layer comprising silicon dioxide ($SiO_2$) (not shown) may disposed between the multi-layer absorber layer 108 and the capping layer 106. The EUV mask 100 uses the same substrate material and dimensions as conventional masks. As such, the substrate 102 typically comprises a silicon based material, such as quartz (i.e., silicon dioxide, $SiO_2$), and the like. The substrate 102 may be any size suitable for use as a photomask. In one embodiment, the substrate 102 has a rectangular shape having sides between about 5-9 inches in length. The substrate 102 may be between about 0.15-0.25 inches thick. In one embodiment, the substrate 102 is about 0.25 inches thick The multi-material layer 104 may be a molybdenum and silicon (Mo/Si) containing layer. For example, in one embodiment, the multi-material layer 104 comprises alternating Mo and Si layers, for example 40 pairs of Mo and Si layers. The multi-material layer 104 may have an EUV light reflectivity of up to 70% at 13.5 nm wavelength. The multi-material layer 104 is generally between 70-140 nm thick.

The capping layer 106 acts as a combined buffer layer and capping layer between the multi-material layer 104 and the multi-layer absorber layer 108. The capping layer 106 generally comprises zirconium (Zr) and silicon (Si) and may be formed to a thickness of between about 8-20 nm. In one embodiment, the thickness of the capping layer 106 is about 10 nm.

The multi-layer absorber layer 108 is an opaque, light-shielding layer and may be between about 40-110 nm thick. The stack thickness of the multi-layer absorber layer 108 and the capping layer 106 is typically between about 70-130 nm, and in one embodiment, is about 100 nm. The low combined thickness of these layers advantageously facilitates meeting the strict overall etch profile tolerances for EUV masks in sub-45 nm technology node applications (e.g., in 32 nm technology node applications and beyond).

The multi-layer absorber layer 108 includes a bulk absorber layer 110 (also referred to as a bulk sub-layer) and a self-mask layer 112 (also referred to as an anti-reflective sub-layer). The bulk absorber layer 110 may be between about 80-85 percent of the thickness of the multi-layer absorber layer 108 (i.e., between about 30-90 nm thick). The bulk absorber layer 110 may comprise tantalum-based materials with essentially no oxygen, such as tantalum silicide-based materials (hereinafter TaSi), nitrogenized tantalum boride-based materials (hereinafter TaBN), and tantalum nitride-based materials (hereinafter TaN).

The self-mask layer 112 may be between about 15-20 percent of the thickness of the multi-layer absorber layer 108 (i.e., between about 10-30 nm thick). The composition of the self-mask layer 112 generally comprises tantalum- and oxygen-based materials. The composition of the self-mask layer 112 corresponds to the composition of the bulk absorber layer 110 and may comprise oxidized and nitrogenized tantalum and silicon-based materials (hereinafter TaSiON) when the bulk absorber layer 110 comprises TaSi; tantalum boron oxide-based materials (hereinafter TaBO) when the bulk absorber layer 110 comprises TaBN; and oxidized and nitrogenized tantalum-based materials (hereinafter TaON) when the bulk absorber layer 110 comprises TaN.

The relation between the composition of the bulk absorber layer 110 and the self-mask layer 112 advantageously provides for reduced defect formation during etching of the EUV mask 100. For example, a first etch process may be utilized to etch the self-mask layer 112 (as described in more detail below), and a second etch process may then be utilized to etch through the bulk absorber layer 110 while maintaining a high etch selectivity of the bulk absorber layer 110 to the self-mask layer 112, thus making the self-mask layer 112 function as hard mask, i.e., a "self-mask," and thereby facilitating use of a thinner photoresist layer 114. This material combination and multi-step etch process advantageously provides lower etch CD bias and better CD uniformity than etching processes utilizing conventional, "soft" photoresist materials.

The photoresist layer 114 comprises any suitable photosensitive resist material, such as an e-beam resist (for example, a chemically amplified resist (CAR)), and may be deposited and patterned in any suitable manner. The photoresist layer 114 may be deposited to a thickness of between about 100-1000 nm. As discussed above, the photoresist layer 114 is deposited atop the self-mask layer 112 and is patterned to form an opening 116, thereby exposing corresponding portions of the self-mask layer 112.

Next, at step 204, the self-mask layer 112 is etched in a first etch process using the photoresist layer 114 as a mask, thereby transferring the pattern of the opening 116 to the self-mask layer 112 (as depicted in FIG. 1B), and thereby exposing corresponding portions of the bulk absorber layer 110. In an embodiment where the self-mask layer 112 comprises TaSiON, the etch selectivity for the self-mask layer 112 over the resist during the first etch process is about 0.5 and the etch selectivity for the self-mask layer 112 over the bulk absorber layer 110 is greater than 8.

The first etch process etches the self-mask layer 112 by exposing the layer (through the opening 116) to species from a first process gas (or gas mixture) comprising at least one of a fluorine-containing gas, carbon tetrachloride ($CCl_4$), or hydrogen chloride (HCl). Examples of suitable fluorine-containing gases include carbon tetrafluoride ($CF_4$), carbon hexafluoride ($C_2F_6$), sulfur hexafluoride ($SF_6$), trifluoromethane ($CHF_3$), and the like. In one embodiment, $CF_4$ is provided at a rate of between about 10-100 standard cubic centimeters per minute (sccm). Optionally, a carrier gas, such as helium (He) or argon (Ar) may be provided at a flow rate of between about 50-200 sccm. One specific process recipe provides $CF_4$ at a rate of about 50 sccm along with a carrier gas at a flow rate of about 100 sccm. The pressure in the process chamber is controlled to less than about 40 mTorr, and in one embodiment, between about 1 and about 10 mTorr, for example 2 mTorr.

A plasma is formed from the first process gas, for example, by applying RF power of between about 300 to about 600 W from a plasma power source to an antenna of the process chamber, as discussed below. It is contemplated that the plasma may be ignited by other methods. In one embodiment, RF power of about 420 W is applied at a frequency of about 13.56 MHz.

Optionally, a substrate bias power is applied to bias the mask 100. The bias power may be less than about 600 W, or in a first example, less than about 100 W, or in a second example, between 20 and about 150 W. One specific process recipe applies about 25 W of bias power. The bias power may further be an RF signal provided at a frequency of between about 1-20 MHz, or in one embodiment, between about 13.56 MHz.

The bias power may optionally be pulsed. The bias power may be pulsed in a duty cycle of between about 10-95 percent, or in one embodiment, between about 20-95 percent. In one embodiment, the biasing source 140 is configured to provide less than about 600 Watts of RF power at a pulse frequency between about 1 to about 10 kHz, with a duty cycle between about 10 to about 95 percent. In another embodiment, the biasing source 140 is configured to provide between about 20 to about 150 Watts of RF power at a pulse frequency between about 2 to about 5 kHz, with a duty cycle between about 20 to about 95 percent.

During processing, the cathode temperature may be maintained at a temperature of between approximately 15-30 degrees Celsius and the temperature of the chamber wall may be maintained at a temperature of between about 50-80 degrees Celsius. In one embodiment, the cathode temperature may be maintained at a temperature of approximately 20 degrees Celsius and the temperature of the chamber wall may be maintained at a temperature of about 65 degrees Celsius.

Next, at step 206, the bulk absorber layer 110 is etched in a second etch process using the self-mask layer 112 and remaining photoresist layer 114 as a mask, thereby transferring the pattern of the opening 116 to the bulk absorber layer 110 (as depicted in FIG. 1C), thereby exposing corresponding portions of the capping layer 106 (or buffer layer, when present). Optionally, the remaining photoresist layer 114 may be removed, or stripped, prior to performing step 206. The second etch process advantageously has a high selectivity of the bulk absorber layer 110 to the self-mask layer 112, thereby allowing the self-mask layer 112 to act as a hard mask for transferring the pattern (e.g., the opening 116) to the bulk absorber layer 110. The second etch process maintains a selectivity for the bulk absorber layer over the self-mask layer of at least 10. In one embodiment where the bulk absorber layer 110 comprises TaSi and where the second process gas comprises $Cl_2$, the etch selectivity for the bulk absorber layer 110 over the resist during is about 3.8 and the etch selectivity for the bulk absorber layer 110 over the self-mask layer 112 is about 15.

The second etch process etches the bulk absorber layer 110 by exposing the layer (through the opening 116) to species from a second process gas (or gas mixture) comprising at least one chlorine containing gas. Examples of suitable chlorine containing gases include chlorine ($Cl_2$), carbon tetrachloride ($CCl_4$), hydrogen chloride (HCl), and the like In one embodiment, the second process gas is provided at a rate of between about 10-200 sccm. Optionally, a carrier gas, such as helium (He) or argon (Ar) may be provided at a flow rate of between about 50-200 sccm. One specific process recipe provides the second process gas at a rate of about 100 sccm along with a carrier gas at a rate of about 100 sccm. The pressure in the process chamber is controlled to less than about 40 mTorr, and in one embodiment, between about 1 and about 10 mTorr, for example 6 mTorr.

A plasma is formed from the second process gas, for example, by applying RF power of between about 300 to about 600 W from a plasma power source to an antenna of the process chamber, as discussed below. It is contemplated that the plasma may be ignited by other methods. In one embodiment, RF power of about 420 W is applied at a frequency of about 13.56 MHz.

Optionally, a substrate bias power is applied to bias the mask 100. The bias power may be less than about 600 W, or in a first example, less than about 100 W, or in a second example, between 20 and about 150 W. One specific process recipe applies about 20 W of bias power. The bias power may further be an RF signal provided at a frequency of between about 1-20 MHz, or in one embodiment, between about 13.56 MHz.

The bias power may optionally be pulsed. The bias power may be pulsed in a duty cycle of between about 10-95 percent, or in one embodiment, between about 20-95 percent. In one embodiment, the biasing source 140 is configured to provide less than about 600 Watts of RF power at a pulse frequency between about 1 to about 10 kHz, with a duty cycle between about 10 to about 95 percent. In another embodiment, the biasing source 140 is configured to provide between about 20 to about 150 Watts of RF power at a pulse frequency between about 2 to about 5 kHz, with a duty cycle between about 20 to about 95 percent.

During processing, the cathode temperature may be maintained at a temperature of between approximately 15-30 degrees Celsius and the temperature of the chamber wall may be maintained at a temperature of between about 50-80 degrees Celsius. In one embodiment, the cathode temperature may be maintained at a temperature of approximately 20 degrees Celsius and the temperature of the chamber wall may be maintained at a temperature of about 65 degrees Celsius.

Upon completion of step 206, the method 200 generally ends and the EUV mask 100 now has the desired pattern transferred through to the multi-layer absorber layer 108 of the EUV mask 100. However, additional processing is contemplated to complete the EUV mask 100. For example, in embodiments where a buffer layer is present, the buffer layer may be etched through to the capping layer 106 using a fluorine-containing gas, such as $SF_6$, $CF_4$, or the like, as known in the art, to complete the structure of the EUV mask 100.

The method 200 advantageously provides an EUV mask 100 having improved CD and uniformity as compared to conventional etch methods. For example, when the bulk absorber layer 110 is etched using the second etch process during step 206, the remaining photoresist 202 may be removed on corners of the opening 116, thereby exposing portions of the self-mask layer 112 to the chlorine gas plasma. However, due to the high selectivity of the bulk absorber layer 110 to the self-mask layer 112 in the chlorine plasma, the CD will not shrink significantly, even though the CD of the photoresist layer 114 may change. Thus, the final CD is mainly determined by the self-mask layer 112 etch during step 204, which, due to the relatively small thickness of the self-mask layer 112, advantageously will not contribute significantly to CD etch bias. In addition, as the local etch CD bias contributes to the etch CD uniformity, a low CD bias will further benefit the CD uniformity control. The method 200 may be advantageously utilized to provide masks having a reduced CD bias, for example, from about 0-10 nm (i.e., less than 10 nm).

Embodiments of the novel etch method provided herein advantageously provide better control over etch CD bias and uniformity. The mask structure and method provides a "zero etch bias" with improved etch CD uniformity control using conventional materials and etch processes, i.e., without a technology challenge.

Figure 3:
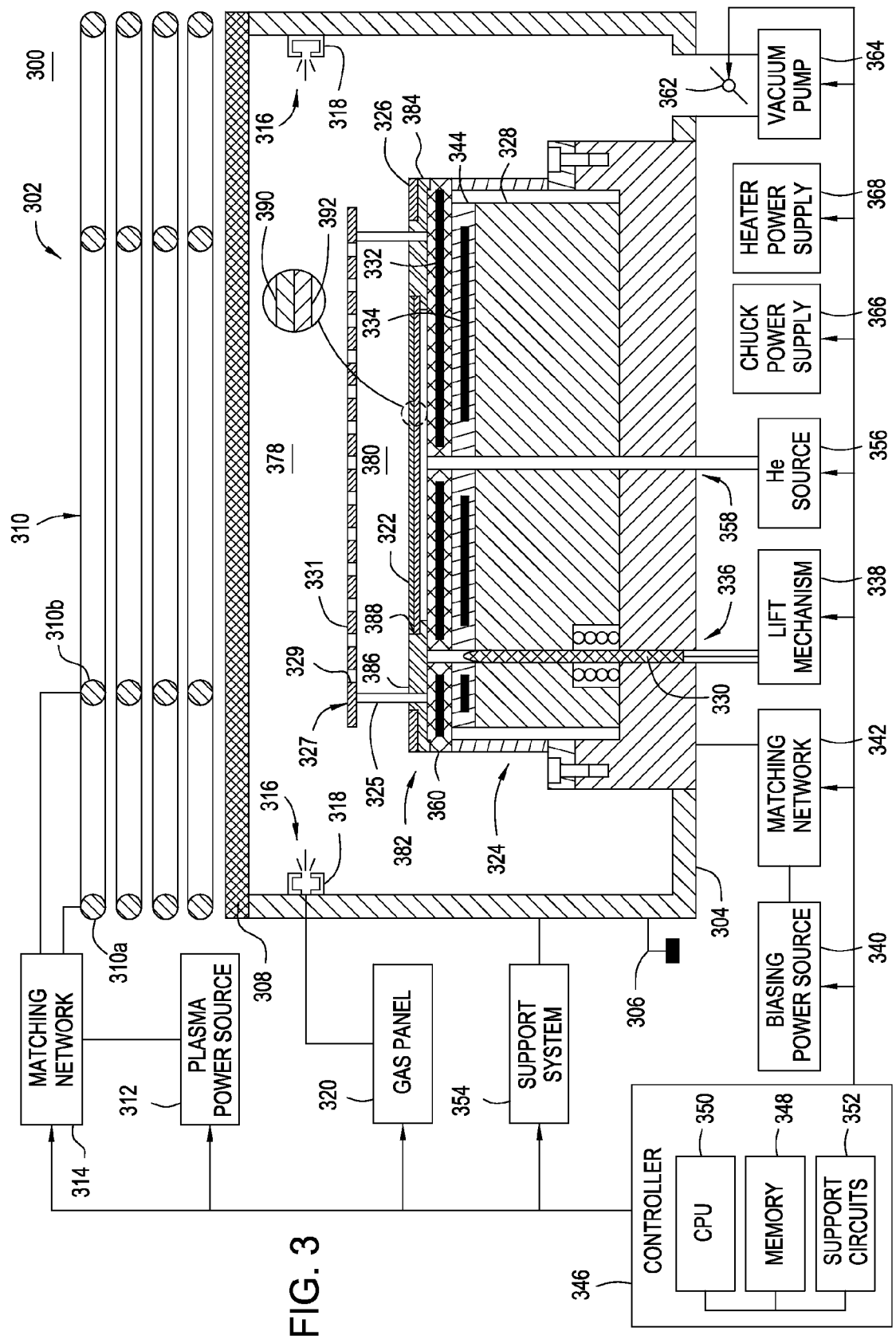
FIG. 3 is a schematic diagram of an etch reactor suitable for EUV mask etching.

FIG. 3 depicts a schematic diagram of one embodiment of an etch reactor 300 in which methods of the present invention may be practiced. Suitable reactors that may be adapted for use with the teachings disclosed herein include, for example, the Decoupled Plasma Source (DPS®) II reactor, or the TETRA™ I and TETRA™ II Photomask etch systems, all of which are available from Applied Materials, Inc. of Santa Clara, Calif. The DPS® II reactor may also be used as a processing module of a CENTURA® integrated semiconductor wafer processing system, also available from Applied Materials, Inc. The particular embodiment of the reactor 300 shown herein is provided for illustrative purposes and should not be used to limit the scope of the invention.

The reactor 300 generally comprises a process chamber 302 having a substrate pedestal 324 within a conductive body (wall) 304, and a controller 346. The chamber 302 has a substantially flat dielectric ceiling 308. Other modifications of the chamber 302 may have other types of ceilings, e.g., a dome-shaped ceiling. An antenna 310 is disposed above the ceiling 308. The antenna 310 comprises one or more inductive coil elements that may be selectively controlled (two co-axial elements 310a and 310b are shown in FIG. 3). The antenna 310 is coupled through a first matching network 314 to a plasma power source 312. The plasma power source 312 is typically capable of producing up to about 3000 Watts (W) at a tunable frequency in a range from about 50 kHz to about 13.56 MHz. In one embodiment, the plasma power source 312 provides about 300 to about 600 W of inductively coupled RF power.

The substrate pedestal (cathode) 324 is coupled through a second matching network 342 to a biasing power source 340. The biasing source 340 provides between about zero to about 600 W at a tunable pulse frequency in the range of about 1 to about 10 kHz. The biasing source 340 produces pulsed RF power output. Alternatively, the biasing source 340 may produce pulsed DC power output. It is contemplated that the source 340 may also provide a constant power output.

In one embodiment, the biasing source 340 is configured to provide RF power less than about 600 Watts at a pulse frequency between about 1 to about 10 kHz, with a duty cycle between about 10 to about 95 percent. In another embodiment, the biasing source 340 is configured to provide RF power between about 20 to about 150 Watts, at a pulse frequency between about 2 to about 5 kHz, with a duty cycle between about 80 to about 95 percent.

In one embodiment, as in a DPS® II reactor, the substrate support pedestal 324 may include an electrostatic chuck 360. The electrostatic chuck 360 comprises at least one clamping electrode 332 and is controlled by a chuck power supply 366. In alternative embodiments, the substrate pedestal 324 may comprise substrate retention mechanisms such as a susceptor clamp ring, a mechanical chuck, and the like.

A gas panel 320 is coupled to the process chamber 302 to provide process gases and/or other gases to the interior of the process chamber 302. In the embodiment depicted in FIG. 3, the gas panel 320 is coupled to one or more inlets 316 formed in a channel 318 in the sidewall 304 of the chamber 302. It is contemplated that the one or more inlets 316 may be provided in other locations, for example, in the ceiling 308 of the process chamber 302.

In one embodiment, the gas panel 320 is adapted to selectively provide one or more process gases through the inlets 316 and into the interior of the process chamber 302 during processing. For example, in one embodiment, the gas panel 320 may be adapted to selectively provide a fluorine-containing and/or a chlorine-containing process gas (or gases) into the interior of the process chamber 302, as described below in connection with methods of etching a mask. During processing, a plasma is formed from the gas and maintained through inductive coupling of power from the plasma power source 312. The plasma may alternatively be formed remotely or ignited by other methods.

The pressure in the chamber 302 is controlled using a throttle valve 362 and a vacuum pump 364. The vacuum pump 364 and throttle valve 362 are capable of maintaining chamber pressures in the range of about 1 to about 20 mTorr.

The temperature of the wall 304 may be controlled using liquid-containing conduits (not shown) that run through the wall 304. Wall temperature is generally maintained at about 65 degrees Celsius. Typically, the chamber wall 304 is formed from a metal (e.g., aluminum, stainless steel, and the like) and is coupled to an electrical ground 306. The process chamber 302 also comprises conventional systems for process control, internal diagnostic, end point detection, and the like. Such systems are collectively shown as support systems 354.

A reticle adapter 382 may be used to secure a substrate (such as a reticle or other workpiece) 322 onto the substrate support pedestal 324. The substrate 322 may comprise multiple layers such as a substrate 390 having a multi-layer structure 392 disposed thereover (similar to the substrate 102, EUV reflective multi-material layer 104, capping layer 106, and multi-layer absorber layer 108 described above with respect to FIG. 1.) The reticle adapter 382 generally includes a lower portion 384 milled to cover an upper surface of the pedestal 324 (for example, the electrostatic chuck 360) and a top portion 386 having an opening 388 that is sized and shaped to hold the substrate 322. The opening 388 is generally substantially centered with respect to the pedestal 324. The adapter 382 is generally formed from a single piece of etch resistant, high temperature resistant material such as polyimide ceramic or quartz. A suitable reticle adapter is disclosed in U.S. Pat. No. 6,251,217, issued on Jun. 26, 2001, and incorporated herein by reference. An edge ring 326 may cover and/or secure the adapter 382 to the pedestal 324.

A lift mechanism 338 is used to lower or raise the adapter 382, and hence, the substrate 322, onto or off of the substrate support pedestal 324. Generally, the lift mechanism 338 comprises a plurality of lift pins (one lift pin 330 is shown) that travel through respective guide holes 336.

In operation, the temperature of the substrate 322 is controlled by stabilizing the temperature of the substrate pedestal 324. In one embodiment, the substrate support pedestal 324 comprises a heater 344 and an optional heat sink 328. The heater 344 may be one or more fluid conduits configured to flow a heat transfer fluid therethrough. In another embodiment, the heater 344 may include at least one heating element 334 that is regulated by a heater power supply 368. Optionally, a backside gas (e.g., helium (He)) from a gas source 356 is provided via a gas conduit 358 to channels that are formed in the pedestal surface under the substrate 322. The backside gas is used to facilitate heat transfer between the pedestal 324 and the substrate 322. During processing, the pedestal 324 may be heated by the embedded heater 344 to a steady-state temperature, which in combination with the helium backside gas, facilitates uniform heating of the substrate 322.

Optionally, an ion-radical shield 327 may be disposed in the chamber body 302 above the pedestal 324. The ion-radical shield 327 is electrically isolated from the chamber walls 304 and the pedestal 324 and generally comprises a substantially flat plate 331 having a plurality of apertures 329. In the embodiment depicted in FIG. 3, the shield 327 is supported in the chamber 302 above the pedestal by a plurality of legs 325. The apertures 329 define a desired open area in the surface of the shield 327 that controls the quantity of ions that pass from a plasma formed in an upper process volume 378 of the process chamber 302 to a lower process volume 380 located between the ion-radical shield 327 and the substrate 322. The greater the open area, the more ions can pass through the ion-radical shield 327. As such, the size and distribution of the apertures 329, along with the thickness of the plate 331 controls the ion density in volume 380. Consequently, the shield 327 is an ion filter. One example of a suitable shield that may be adapted to benefit from the invention is described in U.S. patent application Ser. No. 10/882,084, filed Jun. 30, 2004 by Kumar, et al., and entitled "METHOD AND APPARATUS FOR PHOTOMASK PLASMA ETCHING," which is hereby incorporated by reference in its entirety.

The controller 346 comprises a central processing unit (CPU) 350, a memory 348, and support circuits 352 for the CPU 350 and facilitates control of the components of the process chamber 302 and, as such, of the etch process, as discussed above. The controller 346 may be one of any form of general-purpose computer processor that can be used in an industrial setting for controlling various chambers and sub-processors. The memory 348 of the controller 346 may be one or more of readily available memory such as random access memory (RAM), read only memory (ROM), floppy disk, hard disk, or any other form of digital storage, local or remote. The support circuits 352 are coupled to the CPU 350 for supporting the processor in a conventional manner. These circuits include cache, power supplies, clock circuits, input/output circuitry and subsystems, and the like. The inventive method is generally stored in the memory 348 or other computer-readable medium accessible to the CPU 350 as a software routine. Alternatively, such software routine may also be stored and/or executed by a second CPU (not shown) that is remotely located from the hardware being controlled by the CPU 350.

Thus, a method for etching an EUV photomask has been provided herein having a CD bias under 10 nm and improved uniformity attributes as compared to conventional masks. Specifically, the EUV mask and etch method disclosed herein provides for lower CD bias and greater uniformity as compared to conventional photomasks and fabrication methods.

While the foregoing is directed to embodiments of the present invention, other and further embodiments of the invention may be devised without departing from the basic scope thereof, and the scope thereof is determined by the claims that follow.

The invention claimed is:

1. A method of etching an extreme ultraviolet photomask, comprising:
   providing a photomask comprising, in order, a substrate, a multi-material layer, a capping layer, and a multi-layer absorber layer, the multilayer absorber layer comprising a self-mask layer disposed over a bulk absorber layer, wherein the self-mask layer comprises tantalum and oxygen and the bulk absorber layer comprises tantalum and essentially no oxygen;
   etching the self-mask layer using a first etch process; and
   etching the bulk absorber layer using a second etch process different than the first, wherein the etch rate of the bulk absorber layer is greater than the etch rate of the self-mask layer during the second etch process.

2. The method of claim 1, further comprising:
   depositing and patterning a photoresist layer atop the self-mask layer prior to etching the self-mask layer.

3. The method of claim 2, wherein the step of depositing and patterning a photoresist layer further comprises:
   depositing and patterning a photoresist layer to a thickness of between about 100-1000 nm.

4. The method of claim 1, wherein the second etch process maintains a selectivity for the bulk absorber layer over the self-mask layer of at least 10.

5. The method of claim 1, wherein the self mask layer comprises one of TaSiON, TaBO, or TaON.

6. The method of claim 1, wherein the bulk absorber layer comprises one of TaSi, TaBN, or TaN.

7. The method of claim 1, wherein the self-mask layer comprises TaSiON and the bulk absorber layer comprises TaSi.

8. The method of claim 1, wherein the self-mask layer comprises TaBO and the bulk absorber layer comprises TaBN.

9. The method of claim 1, wherein the self-mask layer comprises TaON and the bulk absorber layer comprises TaN.

10. The method of claim 1, wherein the first etch process comprises:
    etching the self-mask layer with a process gas comprising at least one of a fluorine containing gas, carbon tetrachloride ($CCl_4$), or hydrogen chloride (HCl).

11. The method of claim 1, wherein the first etch process comprises:
    etching the self-mask layer with a process gas comprising at least one of trifluoromethane ($CHF_3$), carbon tetrafluoride ($CF_4$), sulfur hexafluoride ($SF_6$), carbon hexafluoride ($C_2F_6$), carbon tetrachloride ($CCl_4$), or hydrogen chloride (HCl).

12. The method of claim 1, wherein the second etch process comprises:
    etching the bulk absorber layer with at least one chlorine containing process gas.

13. The method of claim 1, wherein the second etch process comprises:
    etching the bulk absorber layer with a process gas comprising at least one of chlorine ($Cl_2$), carbon tetrachloride ($CCl_4$), or hydrogen chloride (HCl).

14. The method of claim 1, wherein the substrate comprises quartz, the multi-material layer comprises molybdenum and silicon, and the capping layer comprises zirconium and silicon.

15. The method of claim 1, wherein the thickness of the capping layer and the multi-material absorber layer is between about 70 and 130 nm.

16. The method of claim 15, wherein the thickness of the capping layer and the multi-material absorber layer is about 100 nm.

17. The method of claim 1, wherein the bulk absorber layer is between about 80-85 percent of the thickness of the multi-layer absorber layer.

18. The method of claim 1, wherein the self-mask layer is between about 15-20 percent of the thickness of the multi-layer absorber layer.

19. The method of claim 1, wherein the thickness of the opaque multi-layer absorber layer is between 40-100 nm.

20. A method for creating an image on a blank extreme ultraviolet photomask comprising a photoresist layer, an opaque layer underlying the photoresist layer having an anti-reflective sub-layer and a bulk sub-layer, a capping layer, an EUV reflective multilayer, and a substrate, the method comprising:
    creating a patterned image in the photoresist layer;
    removing portions of the photoresist layer that do not correspond to the patterned image thereby exposing portions of the anti-reflective sub-layer of the opaque layer not corresponding to the patterned image;
    removing the exposed portions of the anti-reflective sub-layer that do not correspond to the patterned image using a first etch process, thereby exposing portions of the bulk sub-layer not corresponding to the patterned image;
    removing the exposed portions of the bulk sub-layer underlying the anti-reflective sub-layer that do not correspond to the patterned image using a second etch process having a bulk sub-layer removal rate that is at least 10 time greater than an anti-reflective sub-layer removal rate, thereby exposing portions of the capping layer that do not correspond to the patterned image; and
    removing the photoresist layer.

21. The method of claim 20, wherein the anti-reflective sub-layer comprises one of TaSiON, TaBO, or TaON.

22. The method of claim 20, wherein the bulk sub-layer comprises one of TaSi, TaBN, or TaN.

23. The method of claim 20, wherein removing the exposed portions of the anti-reflective sub-layer comprises:
    etching the anti-reflective sub-layer with a process gas comprising at least one of a fluorine containing gas, carbon tetrachloride ($CCl_4$), or hydrogen chloride (HCl).

24. The method of claim 20, wherein removing the exposed portions of the anti-reflective sub-layer comprises:
    etching the anti-reflective sub-layer with a process gas comprising at least one of trifluoromethane ($CHF_3$), carbon tetrafluoride ($CF_4$), sulfur hexafluoride ($SF_6$), carbon hexafluoride ($C_2F_6$), carbon tetrachloride ($CCl_4$), or hydrogen chloride (HCl).

25. The method of claim 20, wherein removing the exposed portions of the bulk sub-layer comprises:
    etching the bulk sub-layer with a process gas comprising at least one chlorine containing gas.

26. The method of claim 20, wherein removing the exposed portions of the bulk sub-layer comprises:
    etching the bulk sub-layer with a process gas comprising at least one of chlorine ($Cl_2$), carbon tetrachloride ($CCl_4$), or hydrogen chloride (HCl).

* * * * *